(12) United States Patent
Park et al.

(10) Patent No.: US 12,418,986 B1
(45) Date of Patent: Sep. 16, 2025

(54) SEMICONDUCTOR DEVICE INCLUDING A MEMORY HUB WITH CHIPLET STRUCTURE

(71) Applicant: COSIGNON, Hanam-si (KR)

(72) Inventors: Sung Ho Park, Incheon (KR); Jang Ho Park, Hanam-si (KR); Hyun Jin Park, Hanam-si (KR); Su yeol Kim, Hanam-si (KR)

(73) Assignee: COSIGNON, Hanam-si (KR)

( * ) Notice: Subject to any disclaimer, the term of this patent is extended or adjusted under 35 U.S.C. 154(b) by 0 days.

(21) Appl. No.: 19/179,107

(22) Filed: Apr. 15, 2025

(30) Foreign Application Priority Data

Aug. 22, 2024 (KR) ........................ 10-2024-0112570

(51) Int. Cl.
*H05K 1/18* (2006.01)

(52) U.S. Cl.
CPC ... *H05K 1/181* (2013.01); *H05K 2201/10159* (2013.01); *H05K 2201/10378* (2013.01); *H05K 2201/10734* (2013.01)

(58) Field of Classification Search
CPC ............ H05K 1/18; H05K 1/181–187; H05K 2201/10159; H05K 2201/10378; H05K 2201/10734; G06F 3/0611; G06F 3/0629; G06F 3/0673; H01L 23/5381–5385
USPC ....... 361/760, 764, 772–774, 790, 795, 803; 257/686–690, 737–738
See application file for complete search history.

(56) References Cited

U.S. PATENT DOCUMENTS

| | | | |
|---|---|---|---|
| 8,064,222 B2 * | 11/2011 | Nishio | G06F 1/184 361/803 |
| 12,314,567 B1 * | 5/2025 | Farjadrad | G06F 3/0629 |
| 2006/0274562 A1 * | 12/2006 | Coteus | G11C 5/04 365/54 |
| 2021/0225827 A1 | 7/2021 | Lanka et al. | |
| 2022/0011960 A1 * | 1/2022 | Tan | G11C 7/109 |
| 2022/0222198 A1 * | 7/2022 | Lanka | G06F 13/4273 |
| 2022/0342840 A1 * | 10/2022 | Das Sharma | G06F 13/4221 |
| 2024/0005777 A1 * | 1/2024 | Doshi | G08C 15/06 |

FOREIGN PATENT DOCUMENTS

KR 1020180055566 A 5/2018

OTHER PUBLICATIONS

Office Action of KR 10-2024-0112570 issued Oct. 2, 2024.

* cited by examiner

*Primary Examiner* — Tuan T Dinh
(74) *Attorney, Agent, or Firm* — Dinsmore & Shohl LLP (57) ABSTRACT

Disclosed is a semiconductor device including a memory hub with a chiplet structure. The semiconductor device includes an interposer, a processor unit placed on the interposer, at least one memory hub placed on the interposer and provided to be physically separated from the processor unit, and at least one memory provided to be physically separated from the memory hub.

3 Claims, 6 Drawing Sheets

FIG. 1

--Prior Art--

SEMICONDUCTOR DEVICE INCLUDING A MEMORY HUB WITH CHIPLET STRUCTURE

CROSS-REFERENCE TO RELATED APPLICATION

The present application claims priority to and the benefit of Korean Patent Application No. 10-2024-0112570, filed on Aug. 22, 2024, in the Korean Intellectual Property Office, the entire disclosure of which is incorporated herein by reference.

BACKGROUND

1. Technical Field

The present disclosure relates to a semiconductor device including a memory hub with a chiplet structure, and a semiconductor design structure. More particularly, the present disclosure relates to a semiconductor design technology for a chiplet-based memory hub using a die-to-die (D2D) technology, which can maximize effective memory bandwidth during on-device artificial intelligence (AI) computation.

2. Related Art

Integrating a large number of functions into a single chip requires a large chip area, thus physically increasing the number of wires needed, thereby making bandwidth expansion difficult. In addition, unnecessary power consumption increases, thus increasing heat generation, requiring additional design and cost for efficient thermal management. Furthermore, due to the integration of various functions, power management and optimization become complicated, which may cause inefficient operation.

In addition, fabricating a semiconductor including a memory and an interface as a single chip significantly increases manufacturing cost when using the latest process node. As the area of a single chip increases, the probability of defect occurrence during the fabrication process increases, resulting in a higher defect rate and lower yield, thereby increasing the unit manufacturing cost. Moreover, an increased number of process steps required for fabricating a complex single chip results in an increase in overall manufacturing cost.

Furthermore, in a memory interface semiconductor manufactured through a conventional bumping process, bumps occupy a relatively large area. Particularly, as a data path extending out of the chip through a physical conductor such as a printed circuit board (PCB) increases, bandwidth per unit area is limited, and the increased length of the data transmission path causes a reduction in transmission speed, resulting in degradation of the system performance.

With the emergence of consumer memories operating at ultra-high frequencies, there is a need for a new chiplet-based memory hub structure and semiconductor design technology capable of enabling high-speed data transmission between chips and realizing data transmission with high bandwidth and low latency, in order to prevent memory bottlenecks occurring in various on-device computation-intensive applications.

SUMMARY

Embodiments of the present disclosure are directed to providing a semiconductor device including a memory hub with a chiplet structure, and a semiconductor design structure.

Furthermore, embodiments of the present disclosure are directed to providing a semiconductor device and a design technology, in which a memory hub is configured based on a chiplet structure, which can connect and form a plurality of individual dies, thereby enabling each chiplet to be fabricated at an optimal process node to achieve defect rate reduction and cost reduction, allowing continuous performance improvement through upgrade and replacement of individual chiplets, and reducing latency through direct connection between chips using a die-to-die (D2D) interface.

Furthermore, embodiments of the present disclosure are directed to providing a semiconductor device and a design technology, which enable direct connection between chips through a D2D interface configured with small-sized micro bumps (uBumps) on an interposer, thereby reducing space required per unit area and enabling high-bandwidth connection between chiplets, realizing data transmission with high low bandwidth and latency, improving efficiency and performance by integrating individual chiplets through the interposer, and achieving reduced power loss and improved power efficiency due to shorter physical distances compared to conventional structures.

In addition, embodiments of the present disclosure are directed to providing a memory interface and memory hub configuration, which adopts a structure such that micro bump (uBump)-based consumer memories are placed on the interposer, making it possible to increase routing density through efficient spatial arrangement, thereby reducing physical distances and thus minimizing signal distortion and latency, enhancing performance and reducing upgrade and development costs through flexible support for increasingly advanced consumer memories operating at ultra-high frequencies, satisfying individual requirements by using consumer memories suited for various applications, and preventing memory bottlenecks occurring in on-device computation-intensive applications through support for high-frequency memories.

The problems to be solved by the present disclosure are not limited to those mentioned above, and other technical problems not specifically mentioned will be clearly understood by those skilled in the art from the following description.

A semiconductor device including a memory hub with a chiplet structure according to embodiments of the present disclosure may include: an interposer; a processor unit placed on the interposer; at least one memory hub placed on the interposed and provided to be physically separated from the processor unit; and at least one memory placed to be physically separated from the at least one memory hub.

Furthermore, the processor unit may include a processor and a die-to-die (D2D) interface unit. The at least one memory hub may include a D2D interface unit and a memory controller. The processor unit and the at least one memory hub may be connected through the D2D interface units.

Furthermore, the D2D interface unit may include a D2D physical interface (PHY) provided at a lower portion, and a D2D controller provided at an upper portion.

In addition, the D2D PHY may include a plurality of micro bumps placed on the interposer, and each of the plurality of micro bumps may have a diameter ranging from 30 μm to 60 μm.

Also, the at least one memory may be packaged with a plurality of micro bumps. The at least one memory may be connected to the at least one memory hub through the interposer.

In addition, the at least one memory may not be packaged with the micro bumps. The semiconductor device may further include a sub-interposer provided between the interposer and the memory. A plurality of micro bumps may be provided under the sub-interposer.

Furthermore, the processor unit and the at least one memory hub may be connected through wires arranged in the interposer, and the at least one memory hub and the at least one memory may be connected through wires arranged in the interposer.

Furthermore, the processor unit and a plurality of memory hubs may be connected, and each of the plurality of memory hubs may connected to a plurality of memories.

DETAILED DESCRIPTION

Hereinafter, the present disclosure will be described in detail with reference to the accompanying drawings so that those skilled in the art can easily practice the present disclosure. However, the present disclosure may be embodied in various different forms and is not limited to the embodiments described herein.

The terms used herein are intended to describe the embodiments and are not intended to limit the present disclosure. In this specification, a singular form also includes a plural form unless specifically stated otherwise in a phrase.

As used herein, the terms "comprise" and "comprising" are intended to denote the existence of components, steps, operations, and/or elements described in the specification, and do not exclude the presence or addition of one or more other components, steps, operations, and/or elements.

In the following description of the present disclosure, a detailed description on well-known arts which is determined to make the gist of the present disclosure unclear will be omitted.

Hereinafter, embodiments according to the present disclosure will be described in detail with reference to the attached drawings. The configuration of the present disclosure and operational effects thereof will be clearly understood through the following detailed description.

Figure 1:
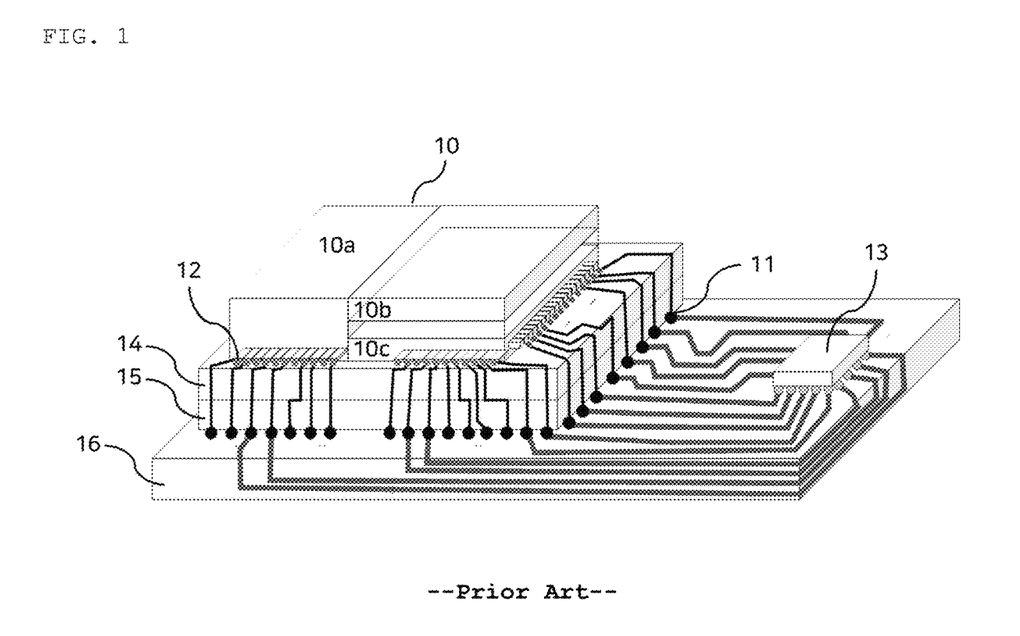
FIG. 1 is a conceptual diagram for explaining a structure of a semiconductor device and a semiconductor package according to a conventional memory interface structure.

FIG. 1 is a conceptual diagram for explaining a structure of a semiconductor device and a semiconductor package according to a conventional memory interface structure.

Referring to FIG. 1, according to the conventional memory interface structure, a single chip 10 formed of one die includes a processor 10a including, for example, a central processing unit (CPU), a graphics processing unit (GPU), a neural processing unit (NPU), or the like, a memory controller 10b, and a memory physical interface (PHY) 10c. The single chip 10 may be connected to a memory 13 through wiring connections via a lower package substrate 15 through a plurality of bumps 12 disposed on an interposer 14, and further via a plurality of package bumps 11 disposed on a printed circuit board (PCB) 16.

In such a case, since a processor function and a memory control function are integrated into the single chip 10, a required area is increased, thus physically increasing the number of wires needed, thereby making bandwidth expansion difficult. Additionally, unnecessary power consumption increases, thus increasing heat generation, requiring additional design and cost for efficient thermal management. Furthermore, due to the integration of various functions, power management and optimization become complicated, which may cause inefficient operation.

In addition, in an existing memory interface semiconductor, the package bumps 11 such as solder ball bumps occupy a large area within the PCB 16 connected to the memory. Particularly, a data path extending out of a chip through a physical conductor such as the PCB 16 becomes longer, thereby limiting bandwidth per unit area. Furthermore, the increased length of the data transmission path reduces transmission speed, which may result in degradation of system performance.

Figure 2A:
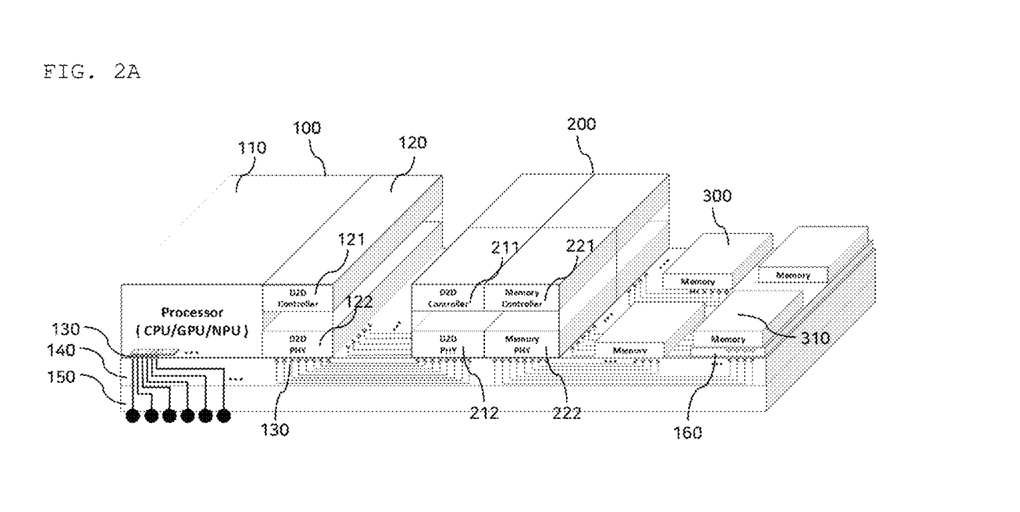
FIGS. 2A and 2B are a perspective view and a cross-sectional view illustrating a semiconductor device that forms a memory hub with a chiplet structure according to an embodiment of the present disclosure.
Figure 2B:
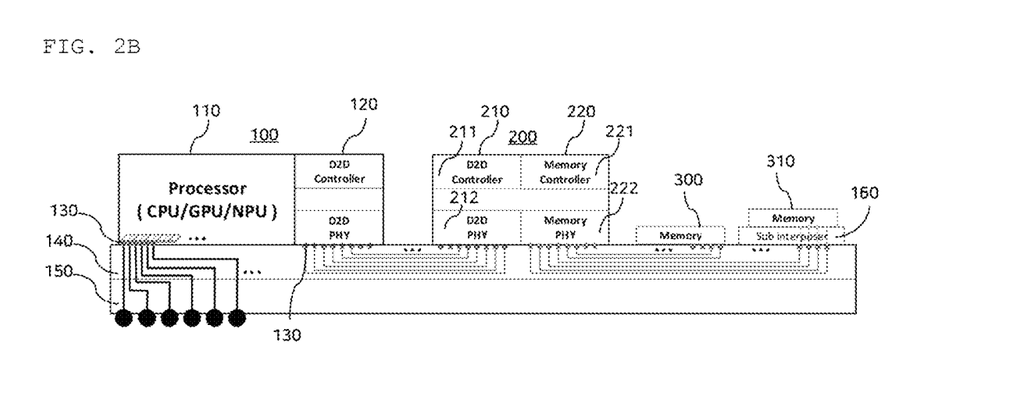

FIGS. 2A and 2B are a perspective view and a cross-sectional view illustrating a semiconductor device that forms a memory hub with a chiplet structure according to an embodiment of the present disclosure.

Referring to FIGS. 2A and 2B, a memory hub system is configured through a chiplet structure in which a processor unit 100 and a memory hub 200 are formed as individual dies and electrically connected to each other. As the chiplet-based individual dies are fabricated at respective optimal process nodes, a defect rate can be reduced, and manufacturing cost can be lowered. Furthermore, continuous performance improvement is achievable through upgrades and replacements of the individual chiplet structures, and latency can be reduced through a direct chip connection through a die-to-die (D2D) interface.

Referring to FIGS. 2A and 2B, a semiconductor device including a memory hub with a chiplet structure may include an interposer 140, a processor unit 100 placed on the interposer 140, one or more memory hubs 200 placed on the interposer 140 and provided to be physically separated from the processor unit 100, and one or more memories 300 provided to be physically separated from the memory hubs 200. The interposer 140 may be placed on a package substrate 150. Furthermore, the processor unit 100, the memory hubs 200, and the memories 300 may be arranged on the interposer 140 in a sideway arrangement rather than being stacked, so that the individual chips can be integrated on the single interposer 140, thereby improving efficiency and performance.

Here, the processor unit 100 may include a processor 110 configured as a CPU, a GPU, an NPU, or the like, and a D2D interface unit 120 for connection with the memory hubs 200, which are physically separated and formed as individual dies. Each of the memory hubs 200 may include a D2D interface unit 210 for connection with the processor 110 formed as an individual die, and a memory controller 220 configured to control the connected memory. The processor unit 100 and the memory hub 200 may be connected to transmit and receive data through the respective D2D interface units 120 and 210. The memory controller 220 of the memory hub 200 may include a memory controller 221 provided at an upper portion and a memory physical interface (PHY) 222 provided at a lower portion.

Furthermore, the D2D interface unit 120 of the processor unit 100 may include a D2D physical interface (PHY) 122 at a lower portion, and a D2D controller 121 at an upper portion. Similarly, the D2D interface unit 210 of the memory hub 200 may include a D2D PHY 212 at a lower portion, and a D2D controller 211 at an upper portion.

In addition, the D2D PHYS 122 and 212 may include a plurality of micro bumps 130 placed on the interposer 140. For example, each of the micro bumps 130 may have a diameter ranging from 30 μm to 60 μm. The memory 300 connected to the memory hub 200 may be packaged with a plurality of micro bumps. The memory 300 may be connected to the memory hub 200 through the memory PHY 222 via the interposer 140. The processor unit 100 and the one or more memory hubs 200 may be connected through wires arranged in the interposer 140 via the micro bumps 130. The one or more memory hubs 200 and the one or more memories 300 may also be connected through wires arranged in the interposer 140 via the micro bumps 130.

As described above, the processor unit 100 and the memory hubs 200, which are formed as individual dies, may be directly connected through the D2D interface configured with the micro bumps on the interposer 140, thus reducing required space per unit area, thereby allowing data transmission with high bandwidth and low latency between chips. Furthermore, the individual chips may be integrated through the interposer, so that efficiency and performance may be improved, and compared to the conventional substrate structure, power loss may be reduced by a reduced physical distance, thereby enhancing power efficiency. In addition, micro bump-based consumer memories may be placed on the interposer to increase routing density through efficient spatial arrangement, thereby reducing physical distances and minimizing signal distortion and latency. Increasingly advanced consumer memories operating at ultra-high frequencies may be flexibly supported, thereby reducing performance upgrade costs and satisfying the requirements of various applications. Here, the consumer memories each refer to an individual memory included in a memory in which a plurality of memory chipsets are used in a module form.

For example, in the case of a memory 310 packaged with general bumps instead of micro bumps, a sub-interposer 160 may be additionally placed between the interposer 140 and the memory 310, and a plurality of micro bumps may be provided under the sub-interposer 160, thereby supporting memories having various bump specifications.

Furthermore, the memories 300 and 310 may be implemented in various forms of memory, and for instance, may include a double data rate synchronous dynamic random access memory (DDR SDRAM), a low power double data rate (LPDDR) SDRAM, a graphics double data rate (GDDR) SDRAM, and a Rambus dynamic random access memory (RDRAM). The memories 300 and 310 may also be implemented as various forms such as a static random access memory (SRAM), a high bandwidth memory (HBM), or a processor-in-memory (PIM), and are not limited thereto.

Figure 3:
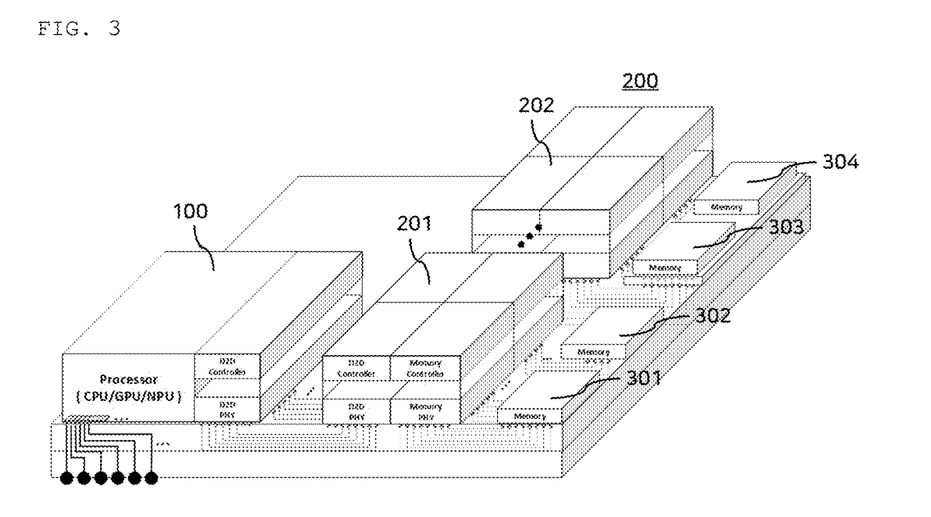
FIG. 3 is an exemplary view for explaining a configuration of a semiconductor device that forms a memory hub with a chiplet structure according to another embodiment of the present disclosure.

FIG. 3 is an exemplary view for explaining a configuration of a semiconductor device that forms a memory hub with a chiplet structure according to another embodiment of the present disclosure.

Referring to FIG. 3, a single processor unit 100 may be connected to a plurality of memory hubs 201 and 202. Each of the memory hubs 201 and 202 may be connected to a plurality of memories 301, 302, 310, and the like. As such, according to the memory hub system structure of the present disclosure, a design structure capable of more freely expanding a plurality of memory hubs and memories using a D2D interface may be provided through flexible scalability.

Figure 4:
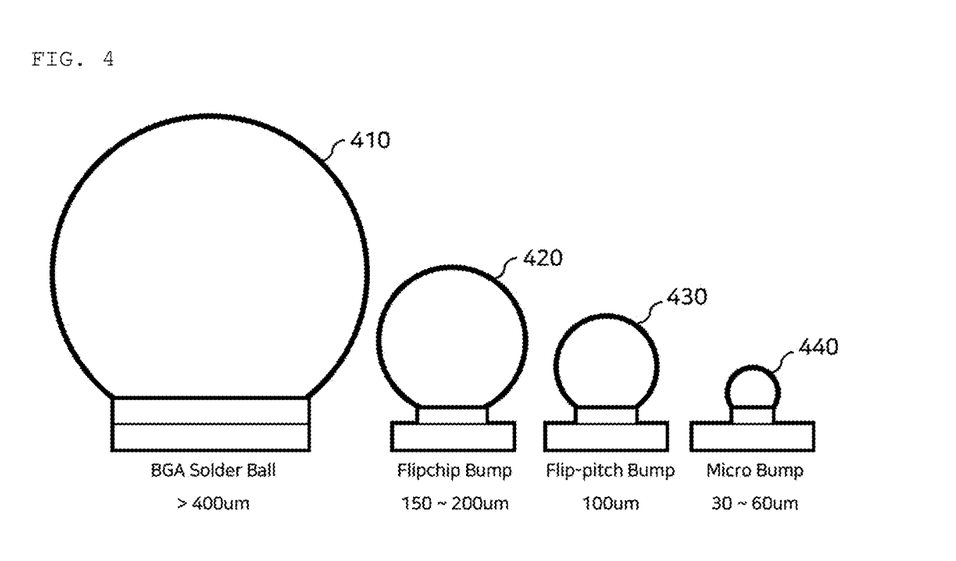
FIG. 4 is an exemplary view comparatively illustrating the size of a micro bump (uBump) according to an embodiment of the present disclosure.

FIG. 4 is an exemplary view comparatively illustrating the size of a micro bump (uBump) according to an embodiment of the present disclosure.

Referring to FIG. 4, each of the micro bumps 130 used in the present disclosure has a diameter ranging from 30 μm to 60 μm. Solder balls used in conventional ball grid array (BGA) type memories have a size of 400 μm or more, standard flip chip bumps used in flip chips have a size of 150 μm to 200 μm, and flip-pitch bumps have a size of approximately 100 μm.

As described above, in the present disclosure, the consumer memory configured with the micro bumps (uBumps) may be connected through the interposer, enabling routing to a greater number of memories per unit area compared to conventional ball-type memories, thereby enabling configuration of memory interface channels the number of which is n times or more the number of memory interface channels of the conventional ball-type memory. In addition, a higher routing density may be achieved compared to an interface configuration using the ball-type consumer memories in the same area. As a result, the physical distance between the consumer memory and the PHY can be reduced, and timing and skew compared to an advantage in matching conventional methods may be obtained. Furthermore, a power mesh may be more precisely configured in chipsets connected through the micro bumps, stable signal output.

Figure 5:
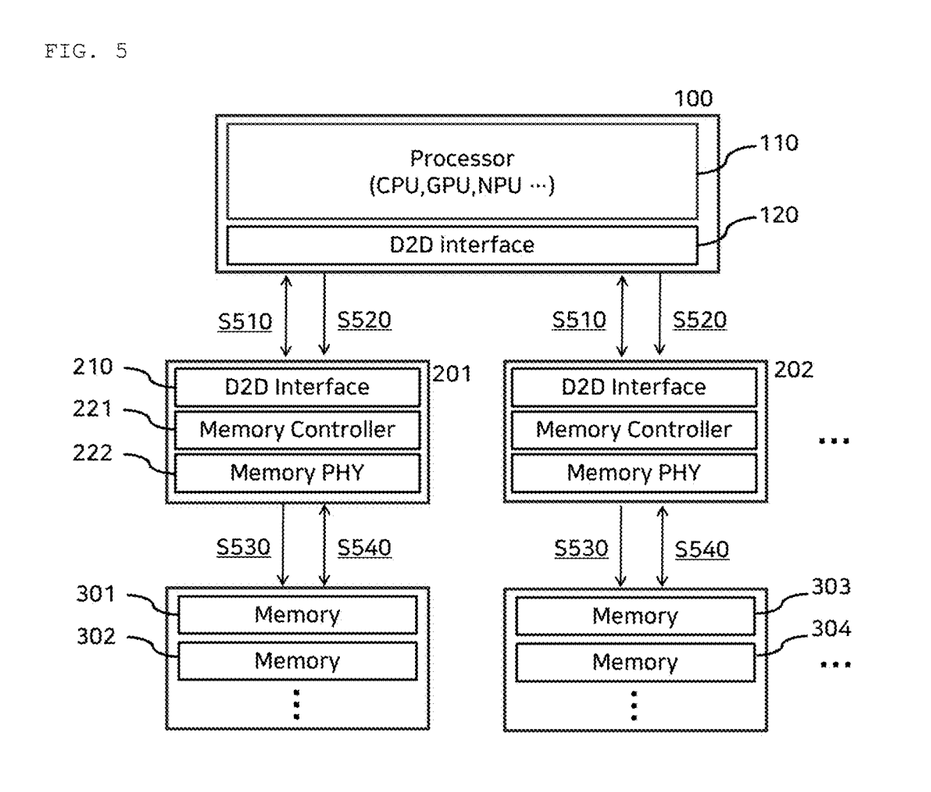
FIG. 5 is a conceptual diagram for explaining a configuration of a memory hub system with a chiplet structure according to an embodiment of the present disclosure.

FIG. 5 is a conceptual diagram for explaining a configuration of a memory hub system with a chiplet structure according to an embodiment of the present disclosure.

Referring to FIG. 5, a D2D interface-based memory hub system according to an embodiment of the present disclosure may include a processor unit 100, a plurality of memory hubs 201 and 202, and a plurality of memories 301, 302, 303, and 304.

The processor unit 100 may include a processor 110 configured as a CPU, a GPU, an NPU, or the like, and a D2D interface unit 120 for a D2D interface. Each of the memory hubs 201 may include a D2D interface unit 210 for a D2D interface, a memory controller 221, and a memory PHY 222.

The processor unit 100 may sense and recognize the plurality of memory hubs 201 and 202 and may recognize a status of a memory resource connected to each memory hub, for example, whether memory allocation is available (S510). The processor unit 100 may set a data path based on the status information of the memory resource recognized through each of the memory hubs 201 and 202 (S520). For example, based on the status information of the memory resource of the first memory hub 201 and the second memory hub 202, it may be determined which one of the first memory hub 201 or the second memory hub 202 is to be used to perform data transmission.

Memory allocation using the determined memory hub may be performed using a plurality of memories connected to each memory hub, so that data may be dynamically distributed (S530). Here, based on the resource status information of each of the plurality of memories connected to the corresponding memory hub, it may be determined which memory is to be used to perform data transmission. Data transmission may be performed using the determined memory (S540).

Figure 6:
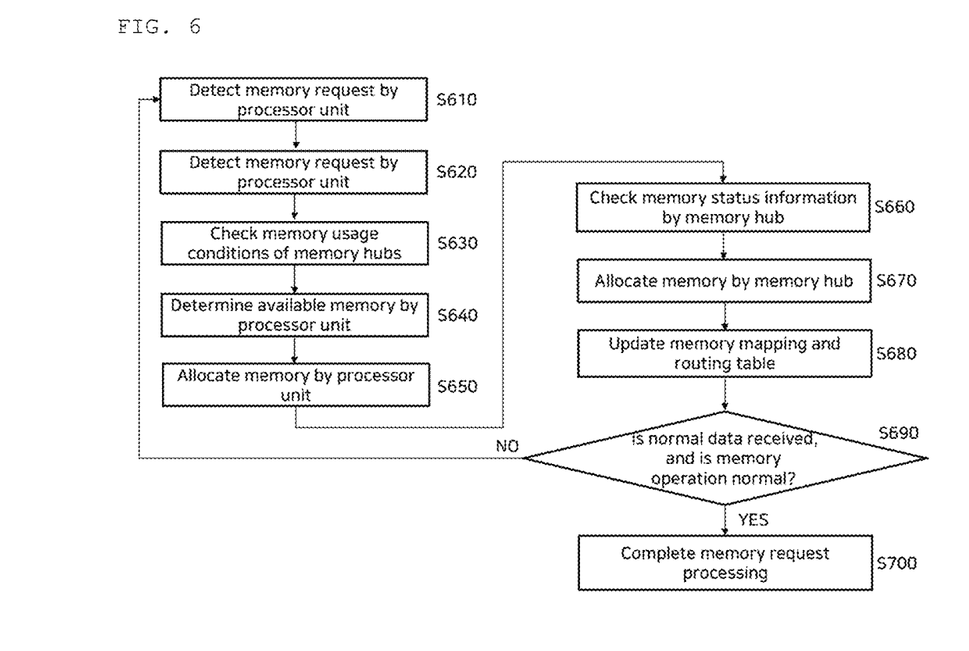
FIG. 6 is a flowchart for explaining a memory operation method in the memory hub system according to an embodiment of the present disclosure.

FIG. 6 is a flowchart for explaining a memory operation method in the memory hub system according to an embodiment of the present disclosure.

Referring to FIG. 6, the processor unit 100, which is a main chipset, may detect a memory resource request (S610).

Next, the processor unit 100 may analyze the memory request (S620), and may check memory usage conditions of the plurality of memory hubs 200 (S630).

The processor unit 100 may determine an available memory (S640), and may allocate the corresponding memory resource (S650).

The memory hub corresponding to the related memory resource may check memory status information (S660). The memory hub may allocate the memory (S670).

Based on the allocated memory, a memory mapping and routing table may be updated (S680).

It may be determined whether data has been normally received and whether the memory operation is normal (S690). If the operation is normal, the memory request processing may be completed (S700).

According to the present disclosure, through an on-device AI consumer memory hub chiplet interface technology, a main processor such as a CPU, GPU, or NPU, which performs on-device AI computations that are expected to increase, may access a high-performance consumer memory via a D2D interface, thereby providing the effect of accelerating high-speed computation.

Furthermore, according to the present disclosure, the combination of interposer-based next-generation consumer memory interface technology and D2D technology enables the implementation of an ultra-high-speed and low-power data transmission technology for on-device AI computation data.

In addition, according to the present disclosure, it is possible to implement a memory access technology through the D2D interface, which is essential for a chiplet configuration.

The effects of the present disclosure are not limited to those described above, and other effects not mentioned will be clearly understood by those skilled in the art from the following description.

The embodiments disclosed in the specification of the present disclosure are merely illustrative, and the present disclosure is not limited thereto. The scope of the present disclosure should be interpreted based on the following claims, and all technical ideas that fall within the range equivalent to the claims should be understood as belonging to the scope of the present disclosure.

What is claimed is:

1. A semiconductor device including a memory hub with a chiplet structure, the semiconductor device comprising:
   an interposer;
   a processor unit placed on the interposer;
   at least one memory hub placed on the interposer and provided to be physically separated from the processor unit; and
   at least one memory placed to be physically separated from the at least one memory hub,
   wherein the processor unit comprises a processor and a die-to-die (D2D) interface unit, the at least one memory hub comprises a D2D interface unit and a memory controller, and the processor unit and the at least one memory hub are connected through the D2D interface units,
   wherein the D2D interface unit of each of the processor unit and the at least one memory hub comprises a D2D physical interface (PHY) provided at a lower portion, and a D2D controller provided at an upper portion,
   wherein the D2D PHY includes a plurality of micro bumps placed on the interposer, and each of the plurality of micro bumps has a diameter ranging from 30 µm to 60 µm,
   wherein the at least one memory is packaged with a plurality of micro bumps having a same diameter as the plurality of micro bumps, and the at least one memory is connected to the at least one memory hub through the interposer, and
   wherein the processor unit and the at least one memory hub are directly connected through the micro bumps via wires arranged in the interposer, and the at least one memory hub and the at least one memory are connected through the micro bumps via wires arranged in the interposer.

2. The semiconductor device as claimed in claim 1, wherein the at least one memory is not packaged with the micro bumps,
   the semiconductor device further comprising a sub-interposer provided between the interposer and the memory, wherein a plurality of micro bumps are provided under the sub-interposer.

3. The semiconductor device as claimed in claim 1, wherein the processor unit and a plurality of memory hubs are connected, and each of the plurality of memory hubs is connected to a plurality of memories.

* * * * *